(12) United States Patent
Parizeau et al.

(10) Patent No.: US 9,907,212 B2
(45) Date of Patent: Feb. 27, 2018

(54) MODULAR HIGH-RISE DATA CENTERS AND METHODS THEREOF

(71) Applicant: Vert.Com Inc., Montreal, Quebec (CA)

(72) Inventors: Marc Parizeau, Quebec (CA); Eric Mateu-Huon, Montreal (CA)

(73) Assignee: VERT.COM INC, Montreal (CA)

( * ) Notice: Subject to any disclaimer, the term of this patent is extended or adjusted under 35 U.S.C. 154(b) by 22 days.

(21) Appl. No.: 15/046,218

(22) Filed: Feb. 17, 2016

(65) Prior Publication Data

US 2016/0249484 A1 Aug. 25, 2016

Related U.S. Application Data

(60) Provisional application No. 62/117,388, filed on Feb. 17, 2015.

(51) Int. Cl.
*H05K 7/20* (2006.01)
*H05K 7/14* (2006.01)

(52) U.S. Cl.
CPC ....... *H05K 7/20745* (2013.01); *H05K 7/1497* (2013.01); *H05K 7/2079* (2013.01); *H05K 7/20136* (2013.01)

(58) Field of Classification Search
CPC ........... H05K 7/20736; H05K 7/20745; H05K 7/1488
See application file for complete search history.

(56) References Cited

U.S. PATENT DOCUMENTS

| 5,544,012 A * | 8/1996 | Koike ................ H05K 7/20572 165/122 |
| 7,630,795 B2 * | 12/2009 | Campbell ............... F28D 15/00 361/701 |
| 8,116,080 B2 * | 2/2012 | Wormsbecher ...... H05K 7/1497 165/104.33 |
| 8,251,785 B2 * | 8/2012 | Schmitt ................ H05K 7/1497 361/695 |
| 8,532,838 B2 * | 9/2013 | Allard ................ H05K 7/20745 62/120 |
| 8,578,726 B2 * | 11/2013 | Hay .................... H05K 7/20745 62/171 |
| 8,763,414 B2 * | 7/2014 | Carlson ................... F25D 17/06 361/695 |
| 8,943,757 B2 * | 2/2015 | Parizeau ................. E04H 1/005 361/694 |
| 9,374,929 B1 * | 6/2016 | Meissner ........... H05K 7/20736 |
| 2007/0135032 A1 * | 6/2007 | Wang ........................ F24F 9/00 454/184 |
| 2010/0048119 A1 * | 2/2010 | Tashiro .............. H05K 7/20745 454/184 |
| 2011/0209852 A1 * | 9/2011 | Enlund .............. H05K 7/20745 165/104.11 |
| 2011/0223849 A1 * | 9/2011 | Ishimine ................. F24F 3/044 454/184 |

(Continued)

*Primary Examiner* — Robert J Hoffberg
*Assistant Examiner* — Matt Dhillon
(74) *Attorney, Agent, or Firm* — Robert Brouillette; Brouillette Legal Inc.

(57) ABSTRACT

A system for building multistory data centers using prefabricated modules that can be both juxtaposed side-by-side and stacked vertically, with fluid communication across stories to create two-way vertical airflow for efficient and cost effective high density heat management.

38 Claims, 10 Drawing Sheets

(56) References Cited

U.S. PATENT DOCUMENTS

| | | | | |
|---|---|---|---|---|
| 2012/0127656 A1* | 5/2012 | Driggers | ............... | G06F 1/183 361/679.47 |
| 2013/0078901 A1* | 3/2013 | Curtin | ............... | H05K 7/20745 454/184 |
| 2014/0211411 A1* | 7/2014 | Slaby | ............... | H05K 7/20745 361/679.46 |
| 2016/0057894 A1* | 2/2016 | Chen | ............... | H05K 7/1497 361/679.47 |

* cited by examiner

MODULAR HIGH-RISE DATA CENTERS AND METHODS THEREOF

CROSS-REFERENCE TO RELATED APPLICATIONS

The present patent application claims the benefits of priority of U.S. Provisional Patent Application No. 62/117,388, entitled "VERTICAL DATA CENTER VENTILATION SYSTEMS AND METHODS FOR MULTI FLOOR BUILDINGS" and filed at the United States Patent and Trademark Office on Feb. 17, 2016.

FIELD OF THE INVENTION

The present invention generally relates to data centers and more particularly to data center modules for building high density multistory data centers that incorporate cross-floor vertical airflow for cooling the computing infrastructure.

BACKGROUND OF THE INVENTION

In recent years, most of the modular data center market has revolved around the form factor of a shipping container. The main advantage of this form factor is to allow for easy transportation of prefabricated data center modules, complete with their power and cooling subsystems, as well as their computing machinery. This approach allows for rapid and cost effective deployment of self-contained computing infrastructure. It is particularly interesting and effective if this infrastructure needs to be redeployed multiple times, for instance in military operations. It's downside, however, is that the dimensions of a standard shipping container can greatly constrain the layout of the computing machinery inside the modules, and can make the access to individual computing cabinets and subsystems more difficult, which in turn impacts the general maintainability of the modular data center.

Inside these data center modules, when the computing cabinets are arranged into rows, the width of a standard shipping container, typically 8-foot, allows for a single row of typically 42-inch deep cabinets, juxtaposed side-by-side. This typical cabinet size barely leaves 2-feet on each side of the row to make aisles for accessing the equipment. One way to circumvent this limitation is to place the computing cabinets on sliding rails to move them forward or backward for maintenance, which is hardly practical, albeit possible.

Another way to circumvent this limitation is by juxtaposing two shipping containers side-by-side and removing the party wall that separates the two containers. In this way, two facing cabinet rows can be formed with enough space for three 3-foot-wide aisles that is typically two lateral cold-aisles and one central hot-aisle. But the next problem is to be able to fit all of the other air handling and air conditioning subsystems within a relatively small space. And because of this small space, many smaller power and cooling subsystems must be integrated which in turn can make the data center costlier, less efficient, and less reliable.

Another popular idea is that of stacking multiple data centers in shipping containers, one on top of the other, to maximize the amount of computing capacity per unit of real-estate. This approach, however, compounds the accessibility problem, and does nothing to reduce the number of components and reliability issues that can stem from it. Redundancy is good, but having too many smaller components instead of a smaller number of larger components can be detrimental to efficiency and reliability. Moreover, making a heap of small data centers does not provide the same flexibility as having one large data center.

Finally, in the context of high power density computing cabinets, for high performance computing, there is a certain misconception about thinking that water needs to be brought all the way to the computing cabinet, even sometimes all the way to the main boards and processors. Even though it is true that carrying heat in water is much more energy efficient than carrying the same amount of heat into air, using water cooling for high performance computing also has its drawbacks, mostly cost and risk of leaks.

SUMMARY OF THE INVENTION

A data center module according to the principles of the present invention generally mitigates at least some of the shortcomings of prior data center modules by vertically stacking a plurality of identical modules that exploit two-way vertical airflow, and by juxtaposing side-by-side a plurality of these modular stacks to form spacious, cost-effective, energy efficient, high density, and high resiliency multistory data centers.

In some aspects of the present disclosure, a data center module in accordance with the present disclosure may be prefabricated and easily transported, much like a shipping container. The said data center module may have dimensions similar to those of a shipping container, but without being a stand-alone complete data center. It is the main brick that enables the construction of full-scale multistory data centers, complete with spacious aisles and high ceilings, capable of accommodating any size of computing cabinets and any power distribution and regulation systems, as usually found in more conventional data centers.

In some aspect of the present disclosure, the data center module aims at being cost-effective as it is essentially a weight-bearing structure which may be assembled using commonly available metal beams and columns. The structure of the data center module is the same or substantially similar for all modules and thus can be produced in series. The data center module comprises HVAC components having simple industrial parts like cooling coils, dampers, filters, and gratings, all of which can, as an example, be ordered by catalogue from many different manufacturers at low cost.

The data center module aims at reducing energy consumption when compared to prior art systems and methods as airflow is managed through large cross-sections and moved using high efficiency and high-capacity variable drive industrial blowers. Energy consumption may be further reduced as heat is efficiently transferred from air to water through large multi row, high efficiency coils.

The data center module further aims at supporting high power densities as the data center may be configured for large volume of air to be moved by high capacity blowers, at relatively low velocity through large cross-sections. The data center module may be further configured for large amount of heat to be removed from the module by using large cross-section high efficiency cooling coils. Moreover, higher power densities may be achieved by bringing water close to the computing cabinets, but not all the way to them.

The data center module also aims at improving resiliency. The resiliency may be improved by configuring the data center for having enough space to allow all or most of HVAC components to be redundant within every module and by configuring adjacent modules to be in fluid communication with one another. Such configuration allows for the redundant capacity of one module to compensate for the partial failure of a neighbour module.

Another aspect of the present invention is the stacking of a plurality of multistory modular data centers to create high-rise modular data centers, and to the juxtaposition of a plurality of modular high-rise modular data centers to create high-rise modular data center complexes with shared infrastructure.

In one aspect of the invention, a data center module is provided for receiving a plurality of computing cabinets comprising at least one computer, the data center module comprising A first and second internal portions, each internal portion comprising a first area and a second area: The first area is configured to allow air to flow in a substantially downward direction and the second area is configured to allow the air to flow in the computer cabinets. The first and second portion further comprise a heat exchanger unit in fluid communication with the first area and the second area and a mean for diverting air from each first area to the heat exchanger unit. The data center module further comprises a third internal portion configured to exhaust air warmed by the at least one computer of the computer cabinets in a generally upward airflow and a support structure adapted to support the vertical stacking of a plurality of modules, the support structure comprising a top portion and a bottom portion being adapted to allow passage of the airflow of each first area of the first and second internal portions and of the third internal portion.

In a further aspect, an air-handling module comprising a support structure adapted to support the vertical stacking of a plurality of modules is provided. The air-handling module further comprises first and second portions, each portion being configured to allow air to flow in a generally downward direction; a third portion configured to allow air to flow in a generally upward vertical airflow, a first blowing mean to transfer a proportion of the upward vertical airflow of the third portion to the first portion and a second blowing means to transfer a proportion of the upward vertical airflow of the third portion to the second portion.

In yet another aspect of the invention, an access module is provided to give access to a data center module as described herein above. The access module generally comprising a first internal access door adapted to access the first area of the first portion of the data center module, a second internal access door adapted to access the first area of the second portion of the data center module, a third internal access door adapted to access the third portion of the data center module, a fourth internal access door adapted to access the second area of the first portion of the data center module and a fifth internal access door adapted to access the second area of the second portion of the data center module The access module is adapted to be juxtaposed to a data center module.

The invention is yet directed to an access module to provide access to an air-handling module as described herein above. The access module comprises a first internal access door adapted to access the first portion of the air-handling module, a second internal access door adapted to access the second portion of the air-handling module, a third internal access door adapted to access the third portion of the air-handling module. The access module is adapted to be juxtaposed to the air-handling module.

In another aspect of the invention, a data center is disclosed, the data center comprising a plurality of data center slices. Each data center slice comprises a plurality of data center modules, as described herein above, being vertically stacked and at least one air-handling module, as described herein above, being positioned on top of the top most data center module, wherein at least two of the plurality of data slices are juxtaposed to each other.

In another aspect of the invention, a data center is disclosed, the data center comprising a plurality of data center slices. Each data center slice comprises: a plurality of data center modules, as described herein above, being vertically stacked and at least one air-handling module, as described herein above, the at least one air-handling module being positioned below the lower most data center module; wherein at least two of the plurality of data slices are juxtaposed to each other.

In a further aspect of the present invention, a data center complex comprising a plurality of any of the data centers described above is disclosed. The data center complex may comprise at least one of the data centers being stacked on top of another of the data centers. The data center complex may further be adapted so at least one data centers is juxtaposed to another of the data centers.

The features of the present invention which are believed to be novel are set forth with particularity in the appended claims.

BRIEF DESCRIPTION OF THE DRAWINGS

The above and other objects, features and advantages of the invention will become more readily apparent from the following description, reference being made to the accompanying drawings in which:

FIG. 1b is a top-sectional view of the data center module of FIG. 1a.

FIG. 2b is a top-sectional view of the data center module of FIG. 2a.

DETAILED DESCRIPTION OF THE PREFERRED EMBODIMENT

A novel vertical data center modules and a method for their large-scale deployment to allow building of high-rise data centers will be described hereinafter. Although the invention is described in terms of specific illustrative embodiments, it is to be understood that the embodiments described herein are by way of example only and that the scope of the invention is not intended to be limited thereby.

Figure 1A:
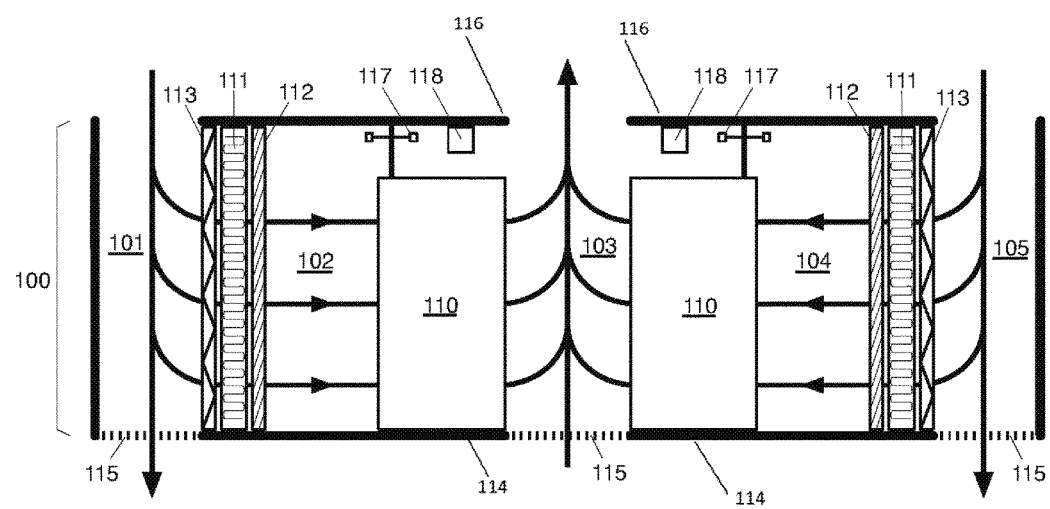
FIG. 1a is a side sectional view of a data center module configured to host a plurality of rows of computing cabinets in accordance with the principles of the present invention.
Figure 1B:
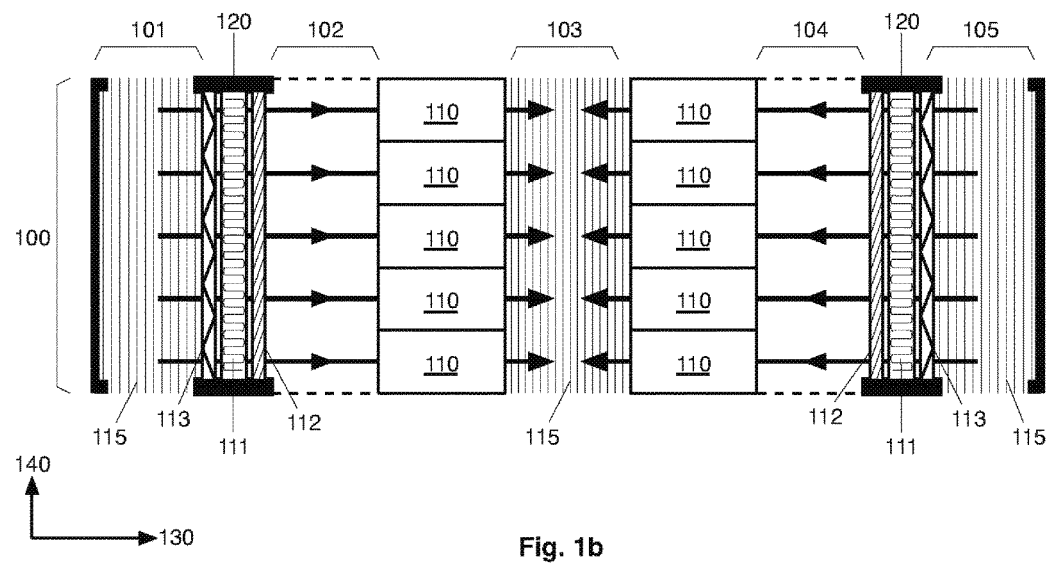

Now referring to FIGS. 1a and 1b, an embodiment of a data center module 100 large enough to accommodate two rows of computing cabinets 110 is shown. More specifically, FIG. 1a is a side sectional view of the module, while FIG. 1B is a top-sectional view of the same module. The data center module 100 has a long axis 130 and a narrow axis 140. In such an embodiment, a plurality of rows of cabinets 110, typically two, are aligned along the narrow axis of the data center module. In the specific illustrated embodiment, the narrow axis of the data center module is about 10 feet wide to accommodate up to five cabinets of standard width (24") per row, while still being narrow enough to make transportation practical. In another embodiment, the data center module could be made narrower, for instance to the width of a common shipping container, which is typically 8' wide. In that case, however, the rows of cabinets 110 would allow only four cabinets per row. The data center module could also be made wider, but a preferred embodiment is to juxtapose a plurality of data center modules side-by-side to reach the desired row length, as will be shown in FIG. 4.

The data center module 100 comprises five distinct areas 101, 102, 103, 104, and 105. A middle area 103 separates the data center module 100 into a first and a second portion or section, typically left and right portions. The first and second portions are typically configured to be a mirror image of the other. In areas 101 and 105, the airflow is substantially vertical and substantially downward.

In a preferred embodiment, the airflow travels from a first module towards a second module located below the first module. Part of the downward airflow is horizontally diverted to areas 102 and 104 in order to feed the computing cabinets 110 with a proportion of cool air allowing the computer to operate in a predetermined range of temperatures, such as the range of temperatures specified by the manufacturer of these computing cabinets. Areas 102 and 104 form two cold aisle plenums that feed the computing cabinets 110 with cold air. Area 103 is a shared hot aisle adapted to exhaust the heat produced by the computing hardware in a generally upward vertical airflow, which is the opposite direction of the vertical airflow in areas 101 and 105.

In another embodiment of the data center module 100, the vertical airflow could be reversed, that is being in the general upward direction for areas 101 and 105, and in the general downward direction for area 103.

In yet another embodiment of the data center module 100, the horizontal airflow diverted from the vertical airflow could also be reversed so that the cold aisle areas 102 and 104 become warm aisles, and hot aisle area 103 become a cold aisle.

Within the data center module 100, the areas 101 and 105 are respectively in fluid communication with areas 102 and 104 through a system of coils 111, dampers 112 and, optionally, filters 113. The coils 111 are used to extract the heat present in the airflow and bring the air temperature to a level recommended for operating computing machinery. The filters 113 are adapted to protect both the coils and the computing machinery from contaminants that may be present in the airflow.

In a further embodiment, the dampers 112 may be motorized. The motorized dampers 112, usually in a fully open state, may be used to produce a pressure drop and thus control the volume of air that may divert from the vertical airflow into the horizontal airflow. The data center module may further comprise a differential pressure sensor 117 between areas 102 and 103 and between areas 104 and 103. Such differential pressure sensor 117 is adapted to regulate the opening of the dampers in such a way that there exists at all times a small positive pressure in the cold aisles 102 and 104.

A data center module 100 comprises a support structure that enables the vertical stacking of a plurality of modules, one on top of the other. This structure is typically made of beams and columns configured to distribute the load on four main weight-bearing columns 120. In some embodiments, the floor 114 of the data center module 100 is made of grating 115 in areas 101, 103, and 105. Such flooring aims at allowing and optimizing vertical airflow. In further embodiments, electrical busways 118 are attached to the bean structure to distribute energy to the computing cabinets 110. In a preferred embodiment, and as shown in FIG. 1a, the support structure comprises a top portion 116 and a bottom portion 114.

Figure 2A:
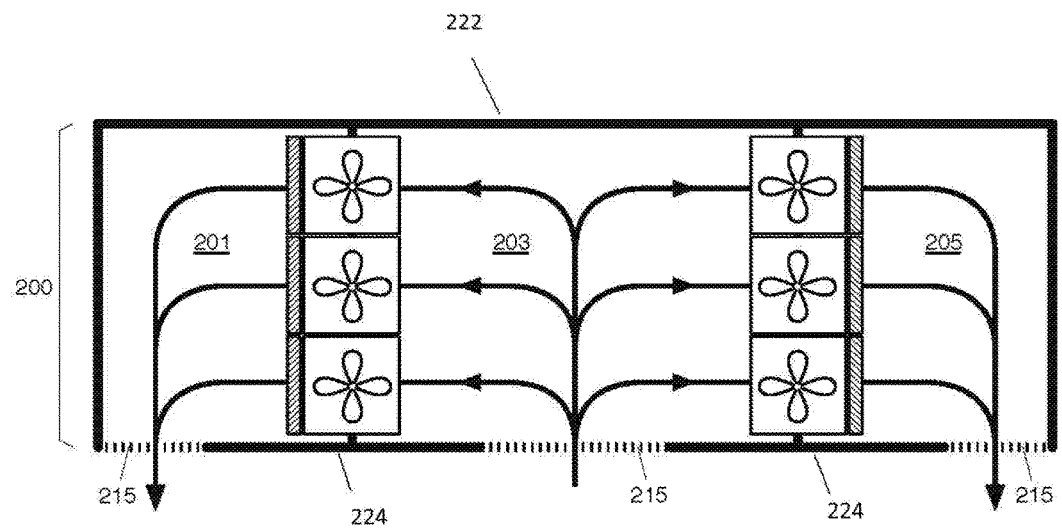
FIG. 2a is a side sectional view of an air-handling module configured to be used with at least one data center module in accordance with the principles of the present invention.
Figure 2B:
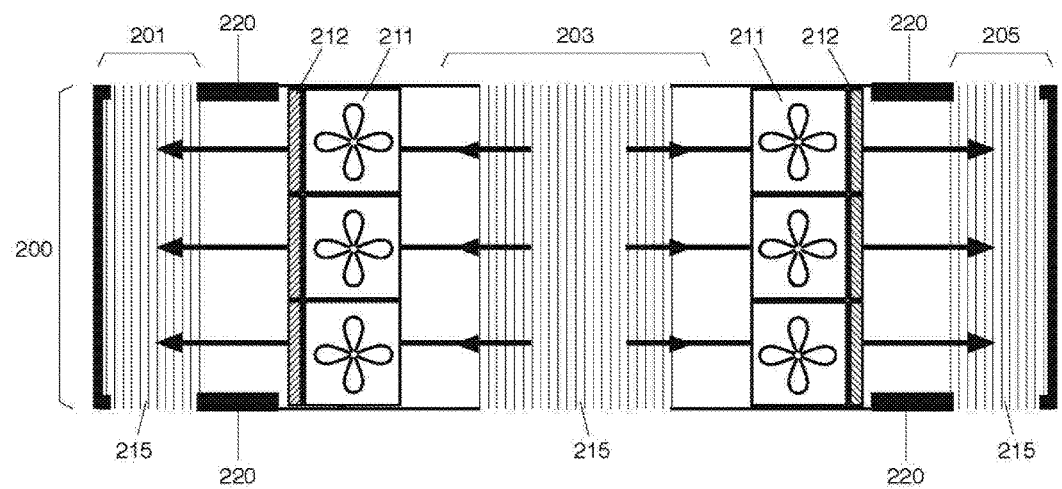

Now referring to FIGS. 2a and 2b, an air-handling module 200 is shown. The air-handling module 200 may be used in conjunction with a plurality of data center modules 100, stacked either below or above the air-handling module 200. The air-handling module 200 comprises three distinct areas 201, 203, and 205. The area 203 is in fluid communication with an area 103 of a data center module 100 immediately below the air-handling module 200 (or above if airflow is reversed). The areas 201 and 205 of the air-handling module 200 are respectively in fluid communication with areas 101 and 105 of the data center module 100 immediately below (or above if airflow is reversed). The objects of the air-handling module 200 is two-fold: to transfer an upward vertical airflow coming from a module below into a downward vertical airflow returning below, or vice-versa if the airflow is reversed, and to create a strong controllable positive pressure to force the airflow across stories, using two fan walls of blowers 211, one for each area 201 and 205. Each blower 211 of these fan walls comprises at least one damper 212, typically in a fully open state. The damper 212 may be closed to inhibit any possibility of air recirculation through the blower 211 if the blower 211 needs to be shutdown. In a preferred embodiment, the support structure and dimensions of the air handling module 200 are substantially identical to those of the data center module 100, including the weight-bearing columns 220, thus enabling the vertical stacking of any module type, one on top of the other. In some embodiments, the floor of the air-handling module 200 is made of grating 215 in areas 201, 203, and 205.

Figure 3:
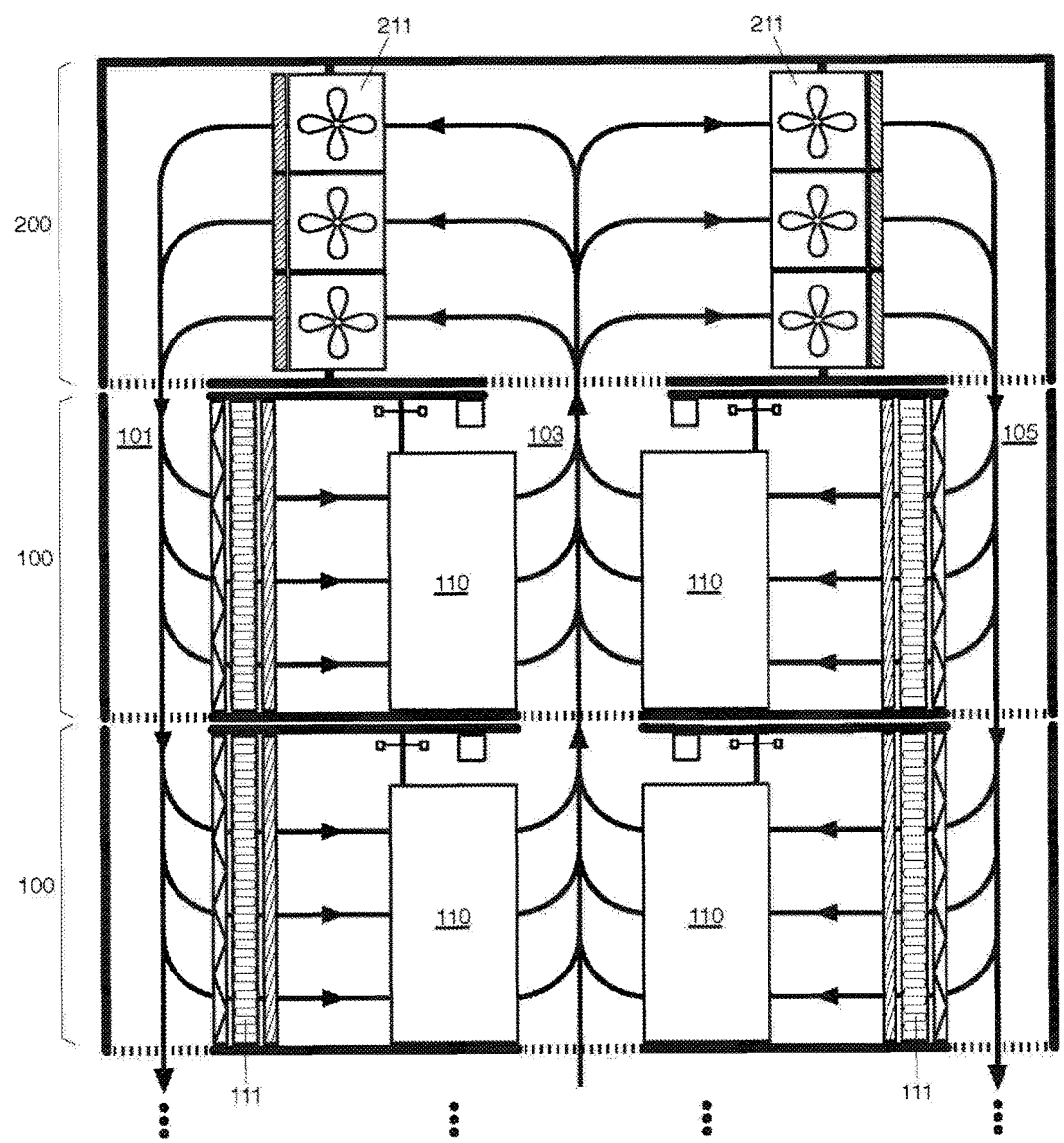
FIG. 3 is a side sectional view of an embodiment comprising three modules, two data center modules and one air handling module, stacked one on top of the other forming a data center slice in accordance with the principles of the present invention.

FIG. 3 illustrates a side sectional view of an embodiment of data center slice comprising three modules stacked one on top of the other. In such an embodiment, the data center slice comprises two data center modules 100 and one air-handling module 200. It should be understood that the number of data center modules 100 sharing an air-handling is typically three or four. One skilled in the art shall understand that the number of data center modules 100 may be higher or lower depending on the requirements of the configurations. Indeed, for low power density configurations, the number of data center modules may be higher depending on the CFM capacity of the fan walls 211, on the cross-section surface of areas 101, 103, and 105, which affects the air velocity of each vertical airflow, on the cross-section surface of the cooling coils 111, which affects the air velocity of the cold aisles 102 and 104 airflow, and on the power requirements of installed computing cabinets 110 within the data center modules 100.

In a preferred embodiment, and as shown in FIG. 2a, the support structure of the air handling module 200 comprises a top portion 222 and a bottom portion 224.

From FIG. 3, one skilled in the art can see that reversing the vertical airflow in areas 101, 103, and 105 of the data center module 100, implies also reversing the horizontal airflow within the module, effectively swapping the locations of cold aisles and hot aisles.

Figure 4:
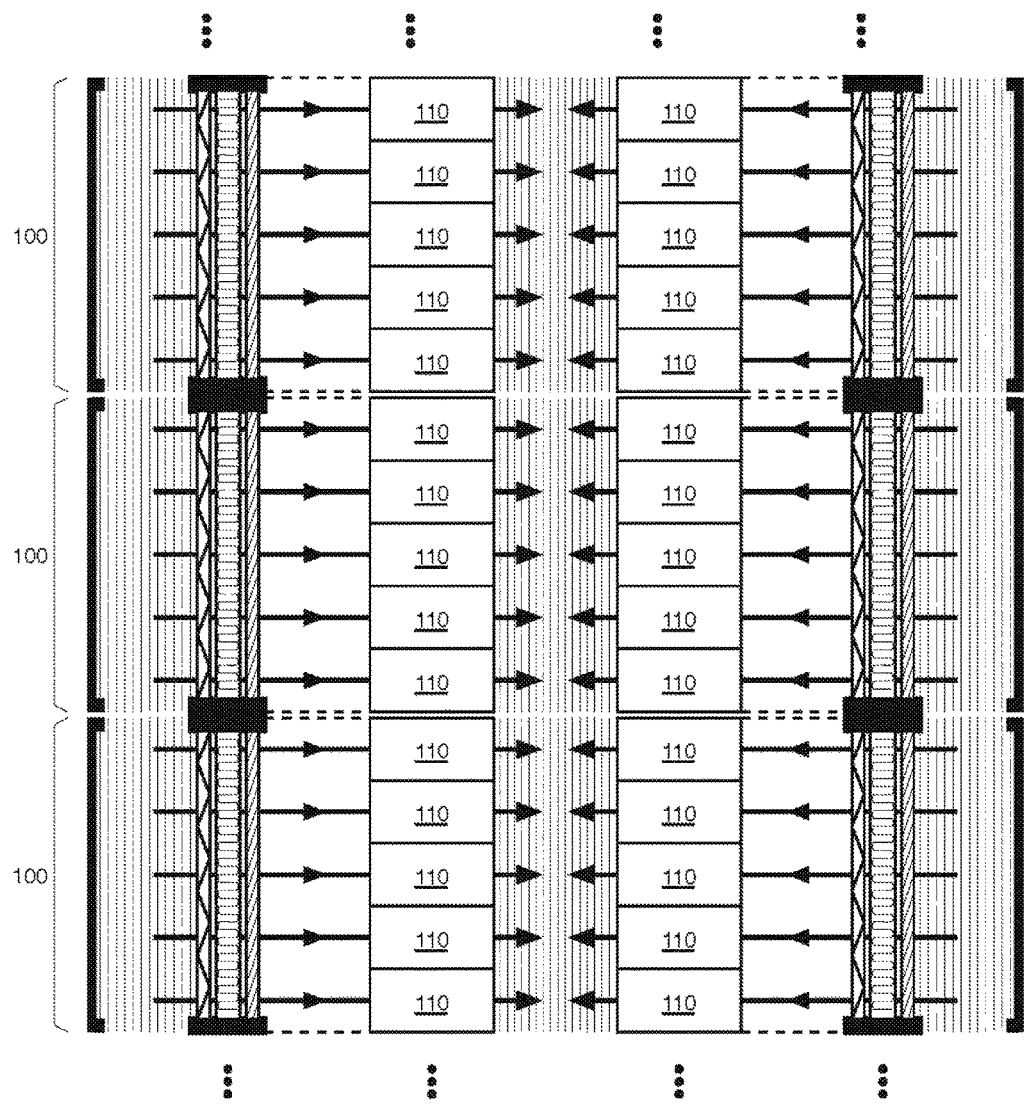
FIG. 4 is a top sectional view of an embodiment comprising three data center modules juxtaposed side-by-side in accordance with the principles of the present invention.

FIG. 4 illustrates a top sectional view of an embodiment of a data center slice comprising three data center modules 100, juxtaposed side-by-side, for creating longer rows of computing cabinets. It should be understood that the present disclosure is not limited by a number of juxtaposed data center modules 100 as juxtaposing any number of data center modules 100 does not affect airflow, neither vertical nor horizontal. In practice, the number of data center modules 100 that can be juxtaposed is limited only by practical considerations like the walking distance to reach the farthest cabinets of each row, as well the maximum amp rating of the electrical busways that distribute energy to the cabinets.

Figure 5:
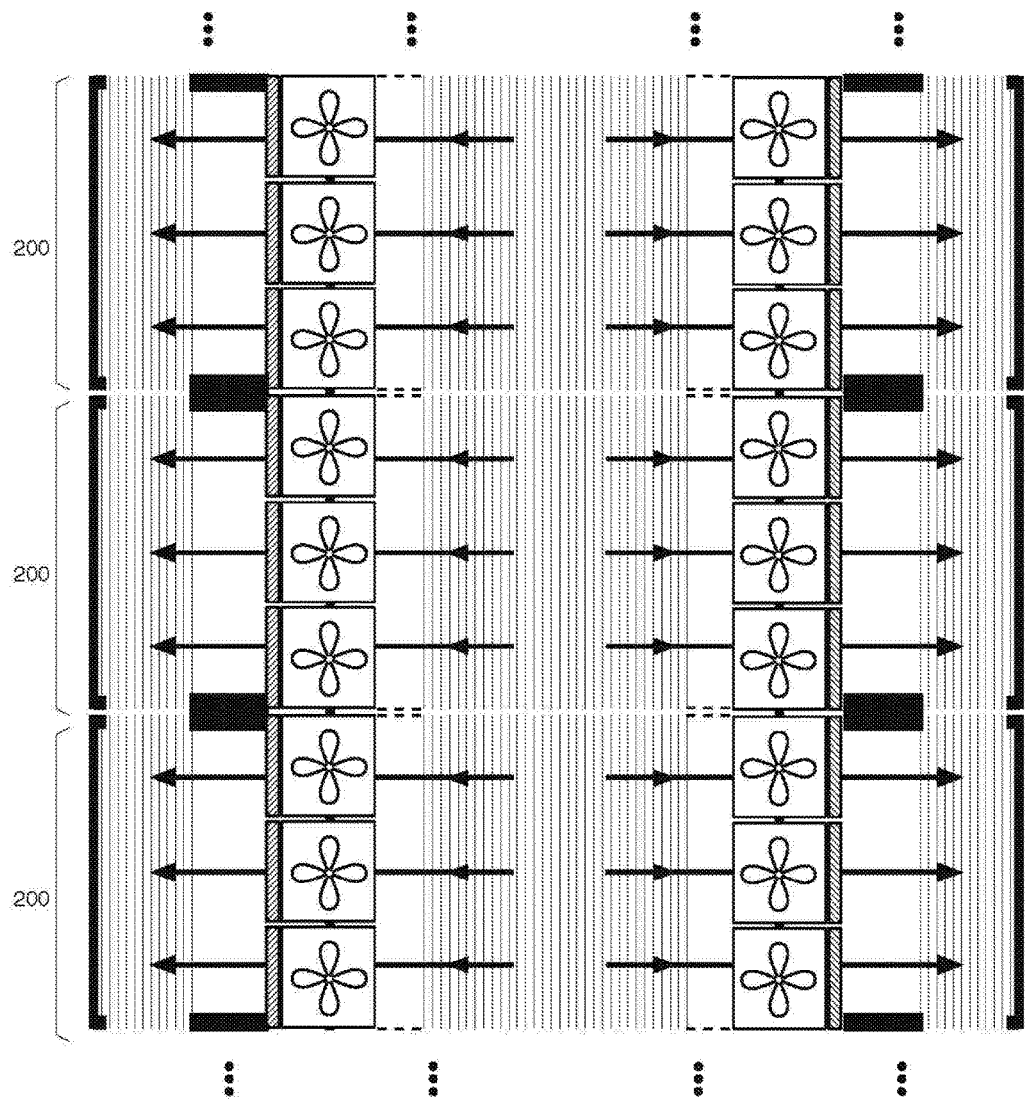
FIG. 5 is a top sectional view of an embodiment comprising three air-handling modules juxtaposed side-by-side in accordance with the principles of the present invention.

FIG. 5 illustrates a top sectional view of an embodiment of the data center slice comprising three air handling modules 200, juxtaposed side-by-side. Again, it should be understood that any number of air-handling modules may be juxtaposed without affecting the airflows, neither vertical nor horizontal. The number of juxtaposed air-handling modules 200 is simply the same as the number of juxtaposed data center modules 100 below or above it. In other words, it is the data center slices of FIG. 3 which are juxtaposed side-by-side to form complete vertical data centers.

Figure 6:
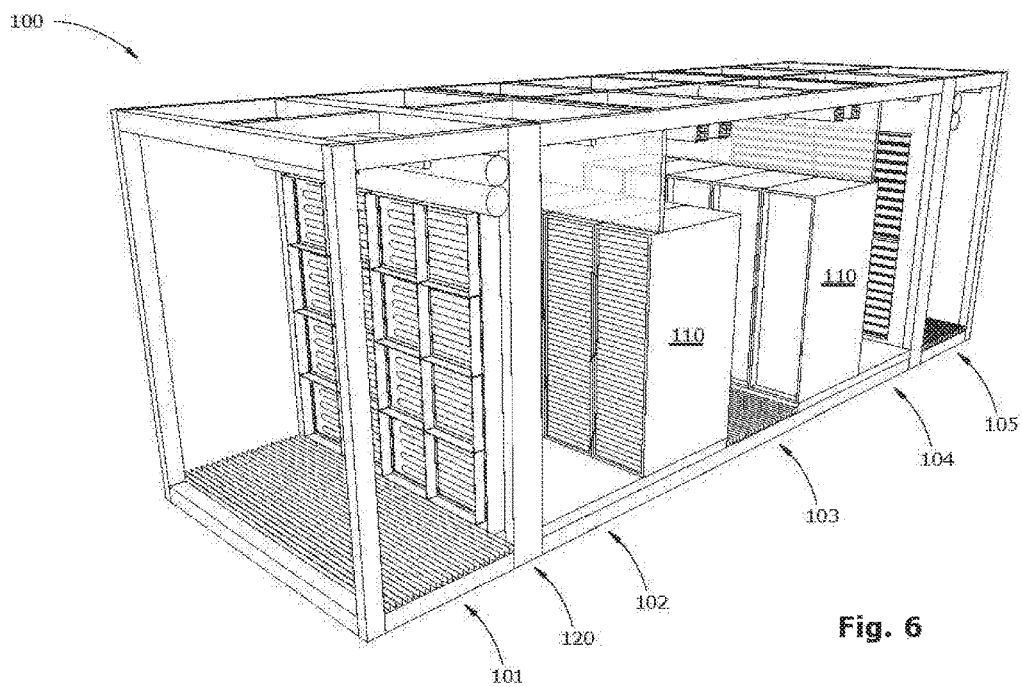
FIG. 6 is a perspective view of the data center module of FIGS. 1a and 1b.
Figure 7:
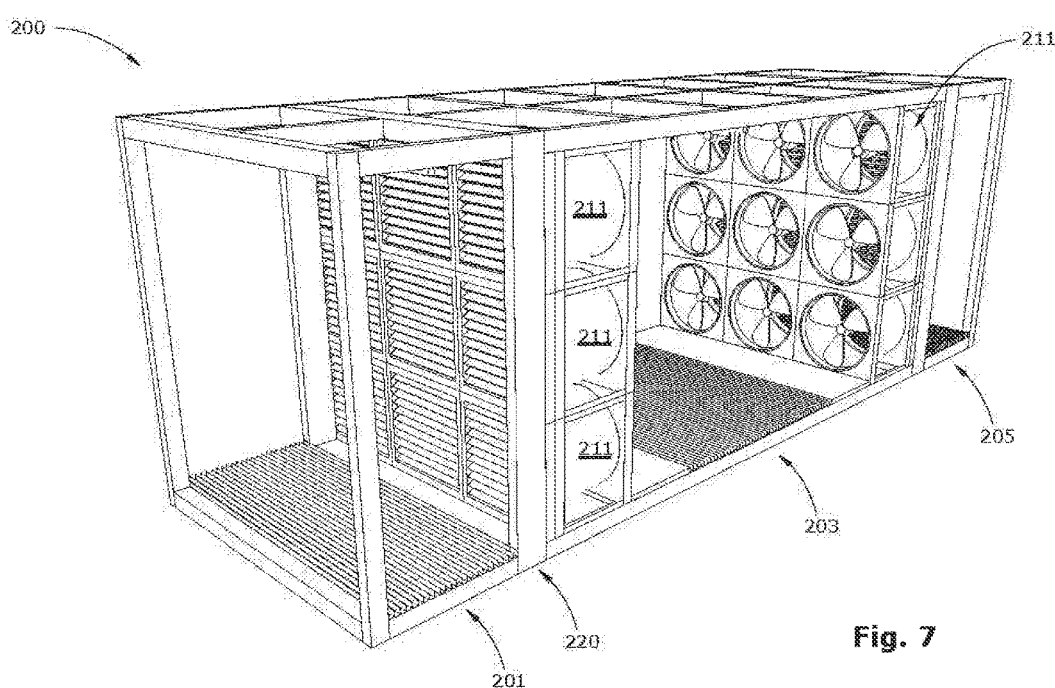
FIG. 7 is a perspective view of the air-handling module of FIGS. 2a and 2b.

FIG. 6 and FIG. 7 respectively are perspective views of the data center module 100 and the air-handling module 200. The perspective view presents a typical support structure having weight-bearing columns 120 or 220.

Figure 8:
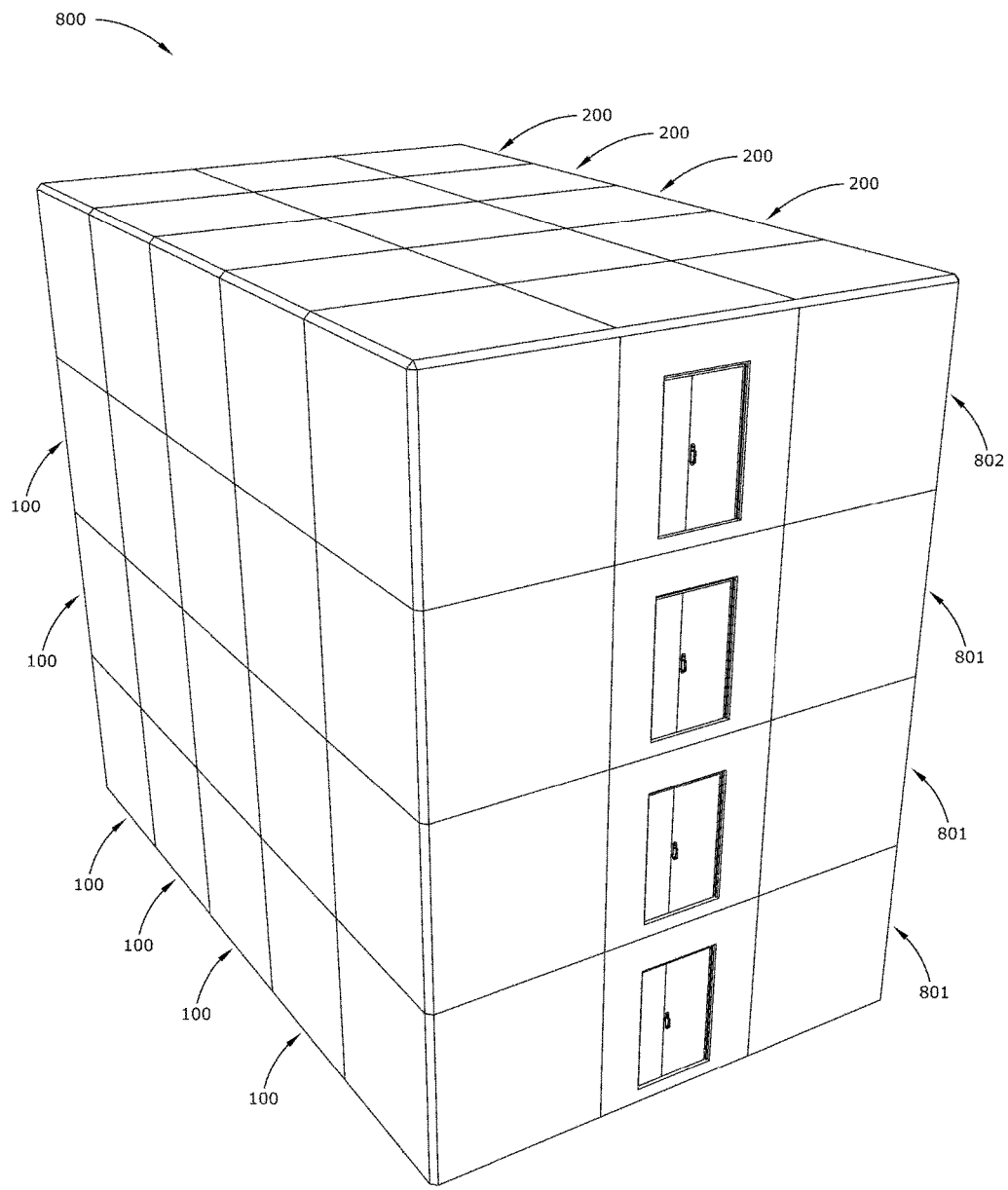
FIG. 8 is a perspective view of an embodiment of a four-story tall of a complete data center comprising a total of twelve data center modules in accordance with the principles of the present invention.

Now referring to FIG. 8 an embodiment of a four-story tall embodiment 800 of a complete data center comprising a total of twelve data center modules 100 arranged in four slices of three modules each, stacked one on top of the other, with four juxtaposed air handling modules 200 at the top level is shown. To these four data center slices, similar to the one illustrated by FIG. 3, a fifth slice of stacked access modules 801 and 802 are added to provide human access to areas 101, 102, 103, 104, and 105 of each level of data center modules 100, and to areas 201, 203, and 205 of the upper level of air handling modules 200. These access modules 801 and 802 typically have the same dimensions as the other two module types, and share the same support structure and weight-bearing columns. They serve as entrance and provide access controls. They can be used for staging equipment or for storing spare parts. They mainly provide internal access doors for accessing each area of each data center story. In the shown embodiment, the access module 801 comprises five internal access doors, one for each of five areas of the data center module 100, while access module 802 comprises three internal access doors, one for each of the three areas of the air-handling module 200. The four-story data center 800 is shown in FIG. 8 with an outer-envelope that makes it a complete weatherproof building. It should be understood that any mean, method or skilled in the art of construction may be used to build the outer-envelope.

Figure 9:
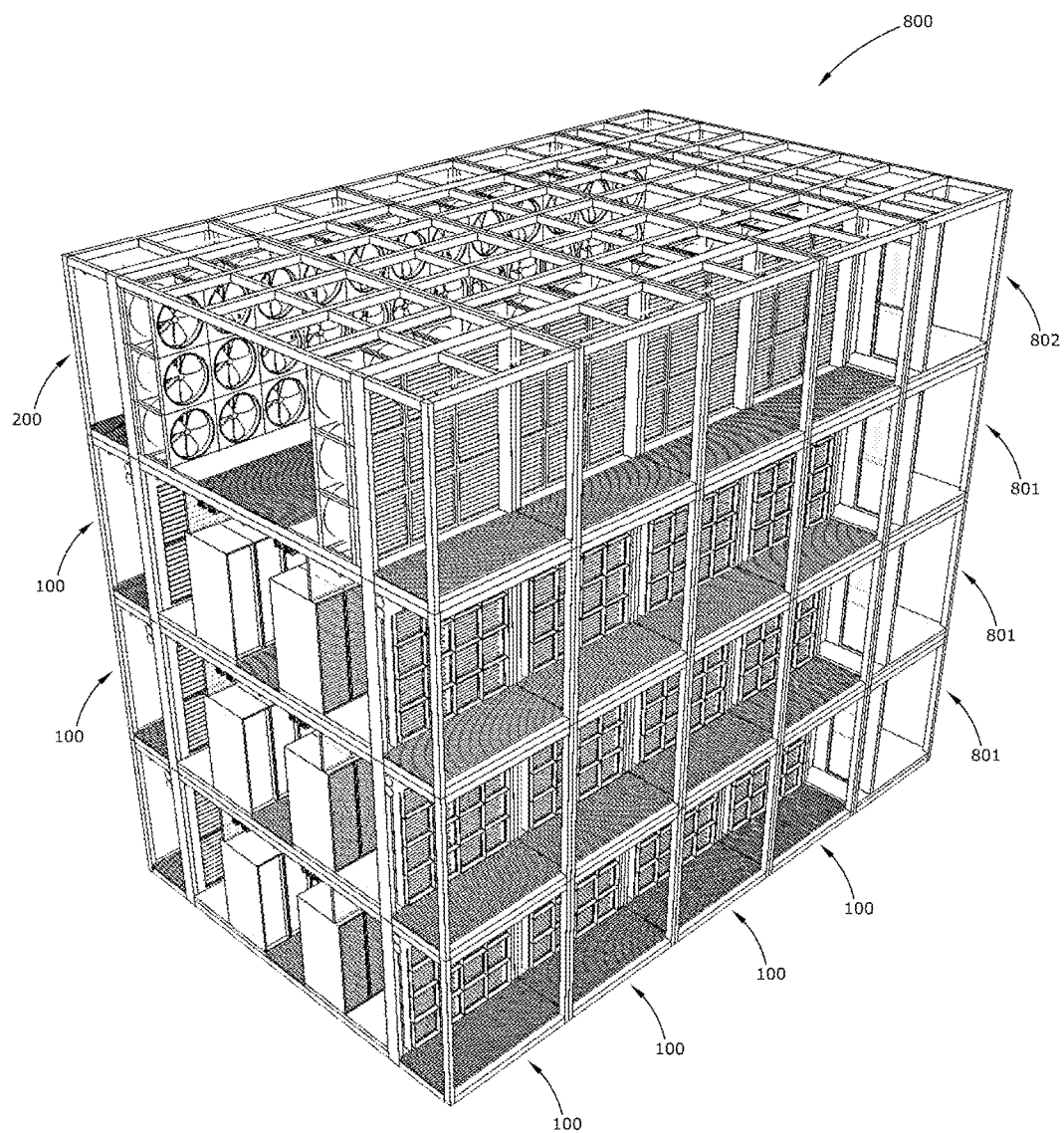
FIG. 9 is a perspective view of an embodiment of the four-story data center of FIG. 8 without an outer envelope.

FIG. 9 illustrates an embodiment of the four-story data center of FIG. 8 without an outer envelope.

Figure 10:
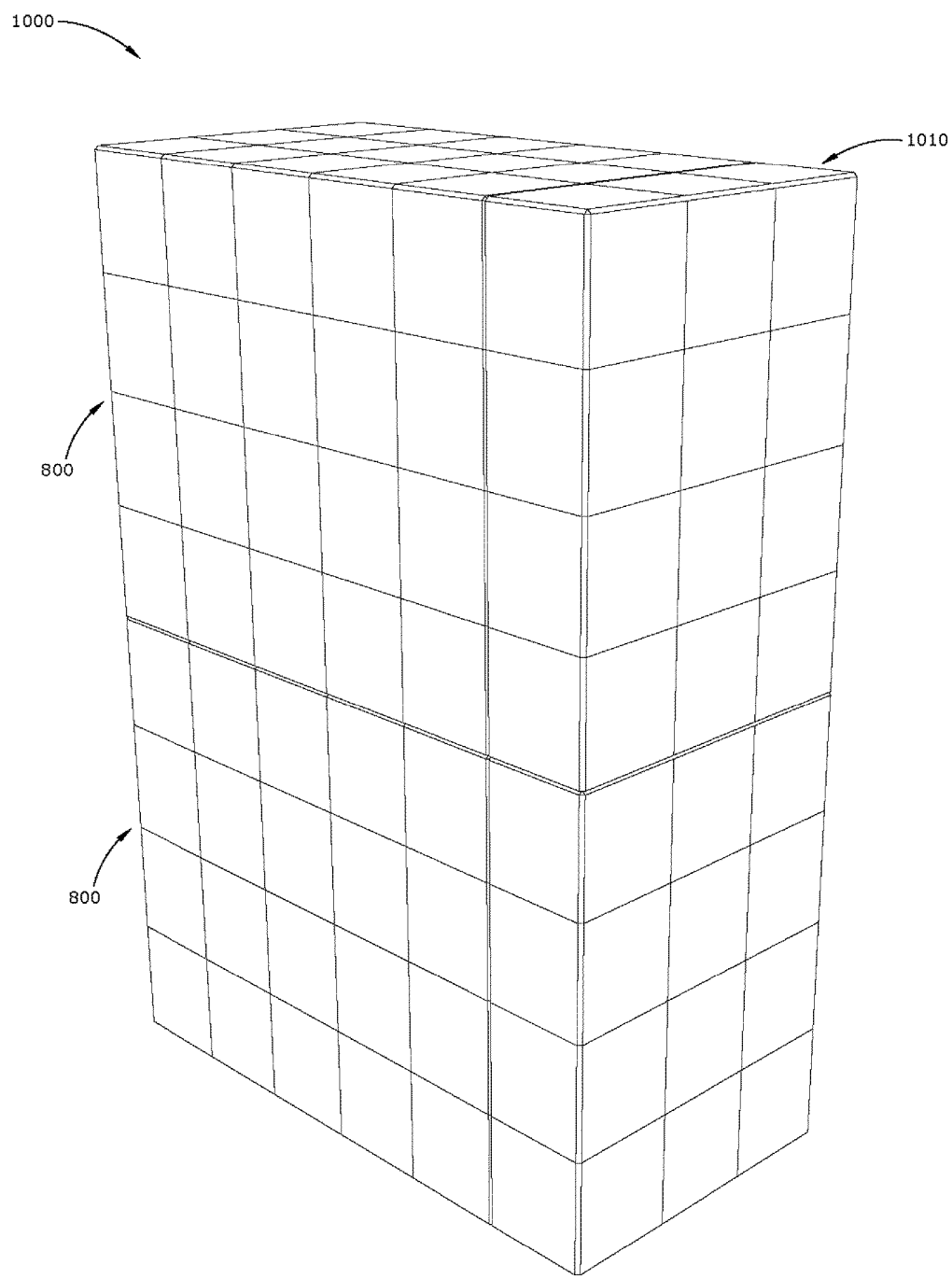
FIG. 10 is a perspective view of an embodiment of a high-rise data center in accordance with the principles of the present invention.

Now referring to FIG. 10 an embodiment of a high-rise data center 1000 is shown. The high rise data center 1000 comprises two independent data centers 800, similar to the data center 800 illustrated in FIG. 8, stacked one on top of the other. The high-rise data center 1000 comprises an additional juxtaposed modular structure 1010 to provide stairs and freight elevators for accessing each floor of the high-rise data center. It should be understood that the maximum number of data centers 800 that can be stacked is not limited to two, but depends mostly on the weight-bearing capacity of the underlying modules. The strength of this structure must be adjusted according to the height that needs to be reached.

Figure 11:
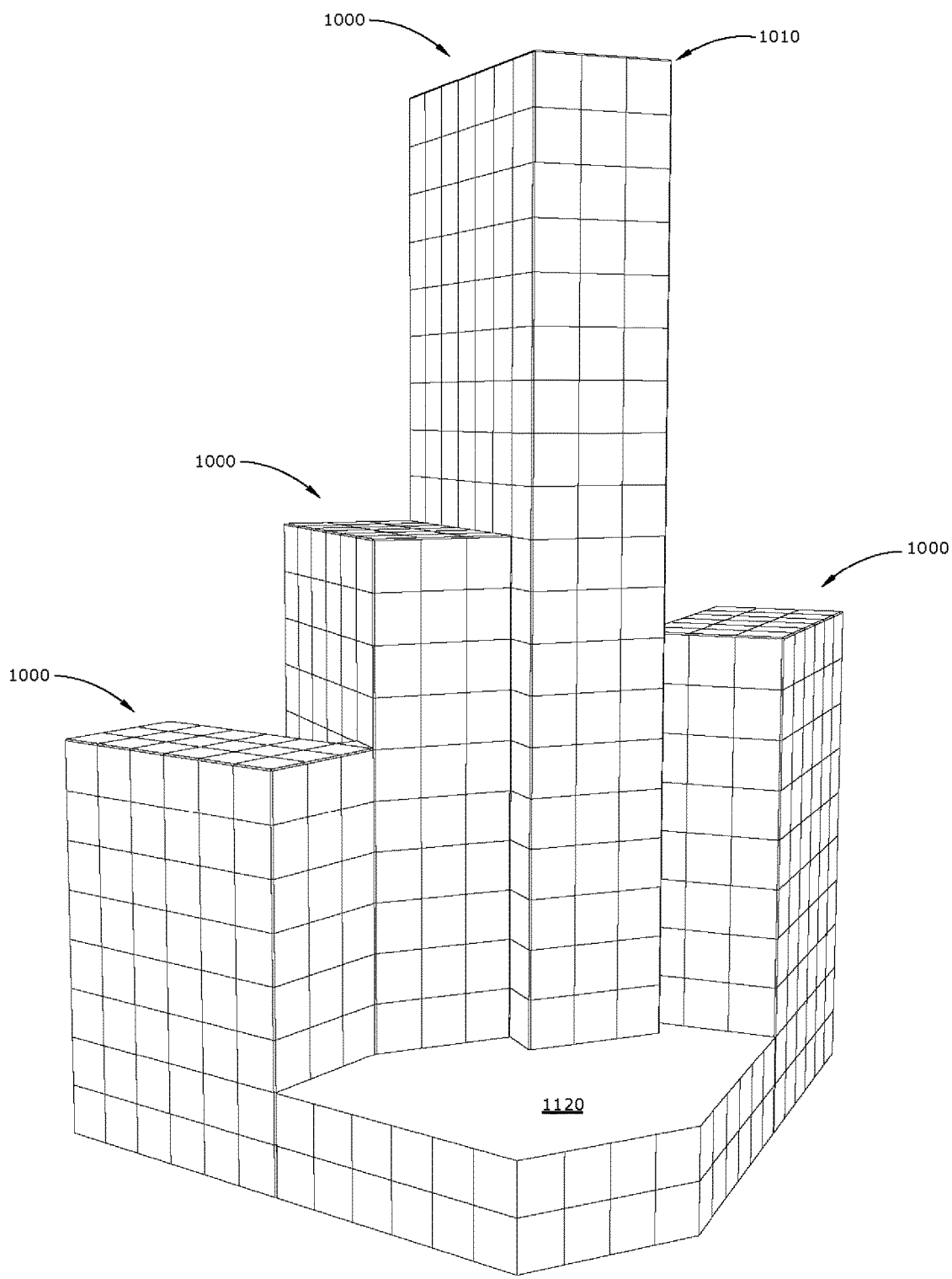
FIG. 11 is a perspective view of a plurality of high-rise data centers juxtaposed side-by-side to form a large scale data center complex in accordance with the principles of the present invention.

It should also be understood that a plurality of high-rise data centers 1000 can also be juxtaposed side-by-side to form large scale data center complexes like the one illustrated by FIG. 11, sharing stairs, corridors and freight elevator access 1010, as well as centralized access controls, electrical power substation, diesel-powered emergency generators, and chilled-water production facilities 1120.

While illustrative and presently preferred embodiment(s) of the invention have been described in detail hereinabove, it is to be understood that the inventive concepts may be otherwise variously embodied and employed and that the appended claims are intended to be construed to include such variations except insofar as limited by the prior art.

The invention claimed is:

1. A modular data center comprising at least one data center slice, each of the at least one data center slice comprising a plurality of stackable modules being vertically stacked, the plurality of stackable modules comprising:
  a plurality of stackable data center IT modules being vertically stacked, each of the stackable data center IT modules comprising:
    a first IT area allowing air to flow downward from a module of the stackable modules above or upward from the stackable module below, the first IT area being configured as an IT input plenum,
    a second IT area allowing the air to flow upward to the stackable module above or downward to the stackable module below, the second IT area being configured as an IT output plenum;
    a third IT area in between the first and second IT areas, the third IT area being fluidly isolated in relation to the third IT areas of other modules of the stackable modules stacked above or below, the third IT area allowing a first vertical airflow from the first IT area to at least partially transfer into a second vertical airflow of the second IT area, the third IT area further comprising:
      a row of heat producing computing cabinets adjacent to one of the IT input and output plenums;
      a heat exchanger system for extracting the produced heat adjacent to another one of the IT input and output plenums; and
      an aisle disposed between the row of heat producing computing cabinets and the heat exchanger system; and
    an internal IT structure adapted to support a weight of at least one module of the stackable modules stacked above each of the data center IT modules, the internal IT structure comprising a top IT portion and a bottom IT portion, the top IT portion and the IT bottom portion being adapted to allow the first and second vertical airflows through each of the first and second IT areas;

at least one stackable data center air-handling module, each of the stackable data center air-handling modules comprising:

a first air-handling area adapted to either allow the air to flow in an upward direction to a respective one of the stackable data center IT modules above, or to allow the air to flow in a downward direction to the respective one of the stackable data center IT modules below, the first air-handling area being configured as an air-handling output plenum;

a second air-handling area adapted to allow the air to flow in a downward direction from the respective one of the stackable data center IT modules above, or to allow the air to flow in an upward direction from the respective one of the stackable data center IT modules below, the second air-handling area being configured as an air-handling input plenum;

at least one blowing mechanism in between the first and second air-handling areas, the at least one blowing mechanism producing a positive pressure effectively forcing the air to transfer from the second air-handling area into the first air-handling area; and an internal air-handling structure adapted to support a weight of at least one module of the stackable modules stacked above each of the at least one data center air-handling module, the internal air-handling structure comprising a top air-handling portion and a bottom air-handling portion, the top and bottom air-handling portions being adapted to allow vertical airflow through each of the first and second air-handling areas, wherein the first IT area and the first air-handling of each of the stackable modules within each of the at least one data center slice are in direct fluid communication with one another, and wherein the second IT area and the second air-handling area of each of the stackable modules within each of the at least one data center slice are in direct fluid communication with one another.

2. The modular data center as claimed in claim 1, wherein each of the stackable modules has a width of a common shipping container.

3. The modular data center as claimed in claim 1, wherein the bottom IT portion of each of the stackable data center IT modules is at least partially made of a grating in each of the first and second IT areas of each of the said data center IT stackable modules, and wherein the bottom air-handling portion of each of the at least one stackable data center air-handling module is at least partially made of the grating in each of the first and second air-handling areas of at least one stackable data center air-handling module.

4. The modular data center as claimed in claim 1, wherein the first and second IT areas of a top-most of the stackable modules of each of the at least one data center slice is configured to block the air from flowing through the top IT portion of the internal IT structure of the said stackable data center IT modules, or wherein one of the first and second air-handling areas of the top-most of the stackable modules of each of the at least one data center slice is configured to block the air from flowing through the top air-handling portion of the internal air-handling structure of the said at least one stackable data center air-handling module.

5. The modular data center as claimed in claim 1, wherein the first and second IT areas of a bottom stackable module of the stackable modules of each of the at least one data center slice is configured to block the air from flowing through the bottom IT portion of the internal IT structure of the said stackable data center module IT modules, or wherein one of the first and second air-handling areas of the bottom-most of the stackable modules of each of the at least one data center slice is configured to block the air from flowing through the bottom air-handling portion of the internal air-handling structure of the said at least one stackable data center air-handling module.

6. The modular data center as claimed in claim 1, wherein for each of the stackable data center IT modules, a proportion of the vertical airflow from the first IT area of is diverted into the vertical airflow of the second IT area, passing through the third IT area.

7. The modular data center as claimed in claim 1, wherein each of the at least one data center slice comprise any arrangement of the stackable data center IT modules or the at least one stackable data center air-handling module.

8. The modular data center as claimed in claim 1, wherein the at least one data slice comprises at least two data center slices, the at least two data center slices being juxtaposed to one another.

9. The modular data center as claimed in claim 8, wherein the first IT area of each of one of more adjacent ones of the stackable data center IT modules within the at least two data center slices juxtaposed to one another are directly fluidly connected to each other, wherein the second IT area of each of the one of more adjacent ones of the stackable data center IT modules within the at least two data center slices juxtaposed to one another are directly fluidly connected to each other, and wherein the third IT area of each of the one of more adjacent ones of the stackable data center IT modules within the at least two data center slices juxtaposed to one another are directly fluidly connected to each other.

10. The modular data center as claimed in claim 8, wherein the first air-handling area of each of one of more adjacent ones of the at least one stackable data center air-handling module within the at least two data center slices juxtaposed to one another are directly fluidly connected to each other, and wherein the second air-handling area of each of one of more adjacent ones of the at least one stackable data center air-handling module within the at least two data center slices juxtaposed to one another are directly fluidly connected to each other.

11. The modular data center as claimed in claim 1, wherein the at least one blowing mechanism of each of the at least one stackable data center air-handling module comprises a variable drive to control a volume of the air that is transferred from the second air-handling area of the at least one stackable data center air-handling module into the first air-handling area of the at least one stackable data center air-handling module.

12. The modular data center as claimed in claim 1, wherein the stackable modules further comprises at least one stackable data center access module, each of the at least one stackable data center access modules being adapted to provide access to at least one of the stackable data center IT modules or to provide access to one or more of the at least one stackable data center air-handling module.

13. The modular data center as claimed in claim 12, wherein each of the stackable data center access module comprising:
- an external door; and
- a plurality of internal doors, each of the internal doors being adapted to access a representative one of the first, second and third areas of one of the at least one of the stackable data center IT modules or one of the at least one stackable data center air-handling module.

14. The modular data center as claimed in claim 1, wherein a modular weatherproof outer-envelope is built over each of the at least one data center slice.

15. A modular data center complex comprising a plurality of modular data centers, each of the modular data centers as claimed in claim 1.

16. The modular data center complex as claimed in claim 15, wherein at least one of the modular data centers is stacked on top of another one of the modular data centers.

17. The modular data center complex as claimed in claim 15, wherein at least one of the modular data centers is juxtaposed to another one of the modular data centers.

18. The modular data center as claimed in claim 1, wherein each of the stackable data center IT modules further comprises at least one damper disposed in the third IT area.

19. The modular data center as claimed in claim 1, wherein each of the stackable data center IT modules further comprises at least one filter disposed in the third IT area.

20. A modular data center comprising at least one data center slice, each of the at least one data center slice comprising a plurality of stackable modules being vertically stacked, the plurality of stackable modules comprising:
- a plurality of stackable data center IT modules being vertically stacked, each of the stackable data center IT modules comprising:
  - a first central IT area comprising first and second sides, the first central IT area being configured either as:
    - an input IT plenum where air flows downward from a module of the stackable modules above or upward from the stackable module below;
    - an output IT plenum where the air flows upward to the stackable module above or downward to the stackable module below;
  - a second IT area and a third IT area, each of the second and third IT areas being respectively on the first and second sides of the first central IT area, each of the second and third IT areas being adapted to be in vertical fluid communication with two or more other of the stackable modules, the second and the third IT areas each being configured either as:
    - the output IT plenum adapted to either allow the air to flow in an upward direction to the stackable module above, or to allow the air to flow in a downward direction to the module below;
    - the input IT plenum adapted to either allow air to flow in the downward direction from the stackable module above, or to allow the air to flow in the upward direction from the stackable module below;
  - wherein when the second and the third IT areas are configured as the output IT plenum, the first central IT area is configured as the input IT plenum, and wherein when the second and the third IT areas are configured as the input IT plenum, the first central IT area is configured as the output IT plenum;
  - a fourth IT area being between the first central IT area and the second IT area and a fifth IT area being between the first central IT area and the third IT area, the fourth and fifth IT areas being fluidly isolated in relation to the fourth and fifth IT areas of other modules of the stackable modules stacked above or below, each of the fourth and fifth IT areas allowing some airflow to transfer from the first central IT area to the second and third IT areas when the first central IT area is being configured as the input IT plenum, and each of the fourth and fifth IT areas allowing some airflow to transfer from the second and third IT areas into the first central IT area when the first central IT area is being configured as the output IT plenum, each of the fourth and fifth IT areas comprising:
    - a row of heat producing computing cabinets adjacent to one of the IT input and output plenums;
    - a heat exchanger system for extracting the produced heat adjacent to another one of the IT input and output plenums; and
    - an aisle disposed between the row of heat producing computing cabinets and the heat exchanger system; and
  - an internal IT structure adapted to support a weight of at least one module of the stackable modules stacked on top of the stackable data center IT module, the internal IT structure comprising a top IT portion and a bottom IT portion, the top and bottom IT portions being adapted to allow vertical airflow through each of the first central, second, and third IT areas;
- at least one stackable data center air-handling module, each of the at least one stackable data center air-handling module comprising:
  - a first central air-handling area comprising first and second sides, the first central air-handling area being configured either as:
    - an output air-handling plenum adapted to either allow the air to flow in the downward direction to the stackable module below, or to allow the air to flow in the upward direction to the stackable module above;
    - an input air-handling plenum adapted to either allow the air to flow in the upward direction from the stackable module below, or to allow the air to flow in the downward direction from the stackable module above;
  - a second air-handling area and a third air-handling area, each of the second and third air-handling areas being respectively on the first and second sides of the first central air-handling area, each of the second and third air-handling areas being adapted to be in vertical fluid communication with the two or more other of the stackable modules, the second and third air-handling areas each being configured either as:
    - the input air-handling plenum adapted to either allow the air to flow in the upward direction from the stackable module below, or to allow the air to flow in the downward direction from the stackable module above;
    - the output air-handling plenum adapted to either allow the air to flow in the downward direction to the stackable module below, or to allow the air to flow in the upward direction to the stackable module above;
  - wherein when the second and the third air-handling areas of the stackable data center air-handling module are configured as the input air-handling plenum, the first central air-handling area of the stackable data center air-handling module is configured as the output air-handling plenum and wherein when the second and the third air-handling areas of the stackable data center air-handling module are configured as the output air-handling plenum, the first central air-handling area of the stackable data center air-handling module is configured as the input air-handling plenum;

at least one first blowing mechanism between the first central and second air-handling areas of the stackable data center air-handling module, the at least one first blowing mechanism being configured to either force an airflow from the second air-handling area into the first central air-handling area or to force an airflow from the first central air-handling area into the second air-handling area;

at least one second blowing mechanism between the first central and third air-handling areas of the stackable data center air-handling module, the at least one second blowing mechanisms being configured to either force an airflow from the third air-handling area into the first central air-handling area or to force an airflow from the first central air-handling area into the third air-handling area; and an internal air-handling structure adapted to support a weight of the at least one module of the stackable modules configured to be stacked on top of the stackable data center air-handling module, the internal air-handling structure comprising a top air-handling portion and a bottom air-handling portion, the top and bottom air-handling portions being adapted to allow vertical airflow through each of the first central, second, and third air-handling areas of the stackable data center air-handling module, wherein the first central IT area and the first central air-handling area of each of the stackable modules within each of the at least one data center slice are in direct fluid communication with one another, wherein the second IT area and the second air-handling area of each of the stackable modules within each of the at least one data center slice are in direct fluid communication with one another, and wherein the third IT area and the third air-handling area of each of the stackable modules within each of the at least one data center slice are in direct fluid communication with one another.

21. The modular data center as claimed in claim 20, wherein each of the stackable modules has width of a common shipping container.

22. The modular data center as claimed in claim 20, wherein the bottom IT portion of each of the stackable data center IT modules is at least partially made of a grating in each of the first, second, and third IT areas of each of the said data center IT stackable modules, and wherein the bottom air-handling portion of each of the at least one stackable data center air-handling module is at least partially made of the grating in each of the first, second, and third air-handling areas of at least one stackable data center air-handling module.

23. The modular data center as claimed in claim 20, wherein the first, second, and third IT areas of a top-most stackable module of the stackable modules of each of the at least one data center slice is configured to block the air from flowing through the top IT portion of the internal IT structure of the top-most stackable module, or wherein the first, second, and third air-handling areas of the top-most of the stackable modules of each of the at least one data center slice are configured to block the air from flowing through the top air-handling portion of the internal air-handling structure of the said at least one stackable data center air-handling module.

24. The modular data center as claimed in claim 20, wherein the first, second, and third IT areas of a bottom-most stackable module of the stackable modules of each of the at least one data center slice are configured to block the air from flowing through the bottom IT portion of the internal IT structure of the said stackable module IT modules, or wherein the first and second air-handling areas of the bottom-most of the stackable modules of each of the at least one data center slice are configured to block the air from flowing through the bottom air-handling portion of the internal air-handling structure of the said at least one stackable data center air-handling module.

25. The modular data center as claimed in claim 20, wherein for each of the stackable data center IT modules, a proportion of the vertical airflow from the first IT area is diverted into the vertical airflow of the second IT area and the third IT area when the first area is configured as the input plenum, and wherein a proportion of the vertical airflow is diverted from the second IT area and third IT area data center IT module into the first IT area when the first IT area of the same stackable data center IT module configured as the output plenum, the vertical airflow passing through the fourth and fifth IT areas of each of the stackable data center IT module.

26. The modular data center as claimed in claim 20, wherein each of the at least one data center slice comprise any arrangement of the stackable data center IT modules or the at least one stackable data center air-handling module.

27. The modular data center as claimed in claim 20, wherein the at least one data slice comprises at least two data center slices, the at least two data center slices being juxtaposed to one another.

28. The modular data center as claimed in claim 27, wherein the first IT area of each of one of more adjacent ones of the stackable data center IT modules within the at least two data center slices juxtaposed to one another are directly fluidly connected to each other, wherein the second IT area of each of the one of more adjacent ones of the stackable data center IT modules within the at least two data center slices juxtaposed to one another are directly fluidly connected to each other, wherein the third IT area of each of the one of more adjacent ones of the stackable data center IT modules within the at least two data center slices juxtaposed to one another are directly fluidly connected to each other, wherein the fourth IT area of each of the one of more adjacent ones of the stackable data center IT modules within the at least two data center slices juxtaposed to one another are directly fluidly connected to each other, and wherein the fifth IT area of each of the one of more adjacent ones of the stackable data center IT modules within the at least two data center slices juxtaposed to one another are directly fluidly connected to each other.

29. The modular data center as claimed in claim 27, wherein the first air-handling area of each of one of more adjacent ones of the at least one stackable data center air-handling module within the at least two data center slices juxtaposed to one another are directly fluidly connected to each other, wherein the second air-handling area of each of the one of more adjacent ones of the at least one stackable data center air-handling module within the at least two data center slices juxtaposed to one another are directly fluidly connected to each other, and wherein the third air-handling area of each of the one of more adjacent ones of the at least one stackable data center air-handling module within the at least two data center slices juxtaposed to one another are directly fluidly connected to each other.

30. The modular data center as claimed in claim 20, wherein at least one of the at least one first and at least one second blowing mechanisms of each of the at least one stackable data center air-handling module comprises a variable drive to control a volume of the air that is transferred from the first area of the said stackable data center air-handling module into the second and/or third area of the said stackable data center air-handling module when the first area of the at least one stackable data center air-handling module is configured as an input plenum, or from the second air-handling area and/or the third air-handling area of the at least one stackable data center air-handling module into the first air-handling area of the at least one stackable data center air-handling module when the first area of the at least one stackable data center air-handling module is being configured as an output plenum.

31. The modular data center as claimed in claim 20, wherein the stackable modules further comprises at least one stackable data center access module, each of the at least one stackable data center access modules being adapted to provide access to at least one of the stackable data center IT modules or to provide access to one or more of the at least one stackable data center air-handling module.

32. The modular data center as claimed in claim 31, wherein the stackable data center access module comprising:
an external door; and
a plurality of internal doors, each of the internal doors being adapted to access a representative one of the first, second and third areas of one of the at least one of the stackable data center IT modules or one of the at least one stackable data center air-handling module.

33. The modular data center as claimed in claim 20, wherein a modular weatherproof outer-envelope is built over each of the at least one data center slice.

34. A modular data center complex comprising a plurality of modular data centers, each of the modular data centers as claimed in claim 20.

35. The data center complex as claimed in claim 34, wherein at least one of the modular data centers is stacked on top of another one of the modular data centers.

36. The data center complex as claimed in claim 34, wherein at least one of the modular data centers is juxtaposed to another one of the modular data centers.

37. The modular data center as claimed in claim 20, wherein each of the stackable data center IT modules further comprises at least one damper disposed in each of the fourth and fifth IT areas.

38. The modular data center as claimed in claim 20, wherein each of the stackable data center IT modules further comprises at least one filter disposed in each of the fourth and fifth IT areas.

* * * * *